US006969618B2

(12) United States Patent
Mouli

(10) Patent No.: US 6,969,618 B2
(45) Date of Patent: Nov. 29, 2005

(54) SOI DEVICE HAVING INCREASED RELIABILITY AND REDUCED FREE FLOATING BODY EFFECTS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 10/226,283

(22) Filed: Aug. 23, 2002

(65) Prior Publication Data

US 2004/0038488 A1 Feb. 26, 2004

(51) Int. Cl.$^7$ ............................................. H01L 21/335
(52) U.S. Cl. ........................... 438/4; 438/466; 438/469; 438/149
(58) Field of Search ............................... 438/4, 149–166, 438/466, 469, FOR 330, FOR 332, 10–12, 17, 18, FOR 141, FOR 142, FOR 134

(56) References Cited

U.S. PATENT DOCUMENTS

| | | | | | |
|---|---|---|---|---|---|
| 5,999,011 | A | * | 12/1999 | Chu et al. | 324/769 |
| 6,147,014 | A | * | 11/2000 | Lyding et al. | 438/798 |
| 6,194,282 | B1 | * | 2/2001 | Niimi et al. | 438/404 |
| 6,198,301 | B1 | * | 3/2001 | Chetlur et al. | 324/769 |
| 6,445,630 | B2 | * | 9/2002 | Ayadi et al. | 365/201 |
| 2002/0031920 | A1 | * | 3/2002 | Lyding et al. | 438/795 |
| 2002/0047169 | A1 | * | 4/2002 | Kunikiyo | 257/410 |
| 2002/0132493 | A1 | * | 9/2002 | Watt et al. | 438/773 |
| 2002/0177290 | A1 | * | 11/2002 | Ramkumar et al. | 438/530 |

OTHER PUBLICATIONS

Chen et al., "Deuterium Isotope Effect for AC and DC Hot–Carrier Degradation of MOS Transistors: A Comparison Study", Apr. 2001, IEEE Transactions on Electron Devices, vol. 48, pp. 813–815.*

Chen et al., "On the Mechanism for Interface Trap Generation in MOS Transistors Due to Channel Hot Carrier Stressing", Jan. 2000. IEEE Electron Device Letters, vol. 21 No. 1, pp. 24–26.*

Cheng et al., "Separation of Hot–Carrier–Induced Interface Trap Creation and Oxide Charge Trapping in PMOSFETs Studied by Hydrogen/Deuterium Isotope Effect", Apr. 2001, IEEE Electron Device Letters, vol. 22 No. 4, pp. 188–190.*

Hess et al., "An Alternative Interpretation of Hot Electron Interface Degradation in NMOSFET's: Isotope Results Irreconcilable with Major Defect Generation by Holes?", Sep. 1999, IEEE Transactions on Electron Devices, vol. 46 No. 9, pp. 1914–1916.*

* cited by examiner

Primary Examiner—George Fourson
(74) Attorney, Agent, or Firm—Dickstein Shapiro Morin & Oshinsky LLP

(57) ABSTRACT

The present invention provides a novel method for increasing the amount of deuterium incorporated into trap sites of a transistor device during a deuterium passivation anneal by electrically pre-stressing the fabricated device prior to a deuterium anneal. The method of the present invention equally applies to SOI and CMOS technology. As a result, the incorporation of more deuterium during a deuterium anneal in the process flow reduces the number of undesirable trap sites.

96 Claims, 3 Drawing Sheets

SOI DEVICE HAVING INCREASED RELIABILITY AND REDUCED FREE FLOATING BODY EFFECTS

FIELD OF THE INVENTION

The present invention relates generally to the field of semiconductor integrated circuit devices and more particularly, to a semiconductor-on-insulator device with reduced free-floating body effects.

BACKGROUND OF THE INVENTION

Silicon-on-insulator (SOI) substrates have been explored as an alternative to other substrates commonly used in fabricating integrated circuit structures. Devices fabricated on SOI substrates demonstrate improved characteristics in very large scale integration circuits (VLSI). SOI devices limit parasitic current since they are built on a buried oxide layer and are completely enclosed by a protective insulating layer, thereby isolating the active device region from the substrate. As a result, parasitic current is prevented from flowing between adjacent transistors sharing a common substrate. SOI devices also have the benefit of reduced capacitance between the source and drain and the semiconductor body resulting in improved transistor performance.

SOI devices have many other advantages over bulk CMOS technology such as higher speeds, higher density, lower power consumption, reduced soft-error rate, and immunity of irradiation. Cheng et al., *Improved Hot-Carrier Reliability of SOI Transistors by Deuteriumn Passivation of Defects at Oxide/Silicon Interfaces*, IEEE Transactions on Electron Devices, Vol. 49., No. 3, March 2002, pgs. 529–531. For instance, SOI devices have lower power consumption because the underside of the crystalline silicon layer has an insulation layer to prevent current leakage. Further, the threshold voltage is lower because the crystalline silicon layer is very thin.

SOI devices are largely differentiated based on their operating state. Particularly, two kinds of operating states can exist for an SOI device: a partially-depleted or a fully-depleted state. A fully-depleted SOI structure has source/drain diffusion regions which extend completely through the thin silicon layer to the insulator layer. Typically, a fully-depleted SOI device has a very thin crystalline silicon layer disposed above the insulating layer.

Conversely, the diffusion regions in a partially-depleted SOI structure extends only partially into or through the thickness of the silicon layer and does not fully extend to the insulator layer as in a fully-depleted SOI device. Typically, the silicon layer is thicker in a partially-depleted SOI structure. As a result, in comparison to a partially-depleted SOI structure, a fully-depleted SOI structure has lower power consumption and threshold voltage. However, SOI structures (both frilly-depleted and partially-depleted structures) are not infallible. SOI structures suffer particularly from free floating body effects ("FBE").

An SOI transistor structure has several material interface areas containing dangling bonds or broken bonds resulting in trap sites. Trap sites are created by incomplete bonded species. Typical trap sites can exist at a gate electrode/gate oxide interface, within the bulk oxide film, and the oxide film/substrate interface. Trap sites are normally uncharged but can become charged regions when electrons and holes are introduced into the oxide and become trapped at a site. For instance, highly energetic electrons or holes present in the oxides can charge trap sites. These highly energetic electrons and holes are called hot carriers.

In essence, semiconductor devices have many electrons present in the valence band. When a highly energetic electron in the conduction band undergoes a collision with another electron in the valence band, an electron-hole pair is created. This process is called impact ionization. Once hot carriers (i.e., energetic electrons or holes) are present in the conduction band, they undesirably contribute to the overall conduction current. For instance, the high electric field present in the drain region can produce such hot carriers. The hot carriers generated become trapped at the trap sites and add an electrical charge contributing to the overall fixed charge of the gate oxide; thus, changing the threshold voltage and operating characteristics of the transistor. Unlike non-SOI devices, SOI devices do not have a body (substrate) contact. Because of the lack of this substrate contact, charges are trapped and can accumulate in the SOI substrate. The presence of accumulated extra charge can lead to the device becoming uncontrollable, creating a "floating body effect" ("FBE") since there is no electrical path to pull the charges off as might be present in a conventional CMOS device. Also, in comparison to CMOS devices, SOI devices have additional traps sites present on the interface with the BOX layer (buried oxide layer). For instance, in fully-depleted SOI devices, the source and drain regions terminate at the BOX layer. Therefore, in the BOX layer, a substrate region is present that is completely confined by $SiO_2$, BOX, and the source and drain, which confines charges at the trap sites.

Ideally, a semiconductor device's gate potential would have complete control over the device's switching characteristics. However, the presence of trapped charges in between the valence band and conduction band, i.e., the forbidden gap, does not allow the gate potential to have complete control. For instance, in NMOS devices, trapped electron charges increase the gate threshold (Vt) thereby decreasing the transconductance and saturation current.

A conventional method of reducing the density of trap sites is by passivating the trap sites with a passivation species at the very end of the fabrication process flow. This passivation step is also called the alloy step or low temperature anneal step (below 500° C.). Ideally, a passivating species occupies and complexes with the trap site making the trap sites resistant to becoming charged.

However, hot carriers, i.e., highly energetic electrons, can displace the passivating species from trap sites. Hot carriers arise through device operation, subsequent processing operations such as plasma processes; and when the oxide film is exposed to radiation environments (i.e., PECVD, sputtering, and ion implantation). As mentioned previously, hot carriers can arise during device operation when electric fields are created by applying voltages across the entire device. As a result, hot carriers decrease the lifetime and reliability of the semiconductor device. Reducing the number of trap sites with a passivation species that is resistant to hot carriers, would greatly enhance the reliability of the device and especially in SOI devices, reduce the FBE normally observed.

One such passivating species utilized is hydrogen. Recently however, deuterium has been shown to be a far superior passivating species than hydrogen by a factor of 30. Cheng et al., *Improved Hot-Carrier Reliability of SOI Transistors by Deuterium Passivation of Defects at Oxide/Silicon Interfaces*, IEEE Transactions on Electron Devices, Vol. 49., No. 3, March 2002, pgs. 529–531. In essence, deuterium is an isotope of hydrogen and possesses a larger molecular size and is less susceptible than hydrogen to being displaced by hot carriers. However, there are limitations in the effectiveness of deuterium passivation utilizing current methods since deuterium does not easily replace nor displace the hydrogen that already occupies some trap sites.

There are many sources of hydrogen during normal integrated circuit fabrication. Any anneal step such as diffusion or oxidation are potential sources of hydrogen. As a result, it is likely that most of the dangling bonds are already passivated by hydrogen prior to a deuterium anneal process. For a deuterium anneal to be effective, it is important to remove these hydrogen complexed bonds as much as possible. Furthermore, removing hydrogen from a passivated trap site requires energy. Current methods of deuterium passivation yield only a marginal one to two percent improvement of device reliability.

The passivation of a silicon dangling bond by hydrogen requires an activation energy of 1.51 eV ($Si^- + H_2 = Si - H + H$). Passivation of a silicon dangling bond by deuterium requires an analogous activation energy of 1.51 eV ($Si^{31} + D_2 = Si-D+D$). Whereas, replacing a hydrogen-passivated bond by deuterium ($Si-H+D_2=Si-D+HD$) requires an activation energy of 1.84 eV. As a result, deuterium incorporation at the silicon/oxide interface is largely limited by the replacement of pre-existing hydrogen with deuterium. Therefore, an efficient method is needed to remove the existing hydrogen from passivated sites prior to the deuterium passivation process.

Accordingly, there is a need for an SOI structure with a reduced fixed oxide charge, lower density of trap sites, and improved resistance to hot carrier effects. There is also a need for an SOI structure that has improved deuterium passivation as a result of a deuterium anneal.

BRIEF SUMMARY OF THE INVENTION

The present invention provides a novel method for increasing the amount of deuterium incorporated into trap sites during a deuterium passivation anneal by electrically pre-stressing the fabricated device prior to a deuterium anneal. In addition, the method of the present invention equally applies to CMOS technology. As a result, the incorporation of more deuterium during a deuterium anneal, in the fabrication process flow, creates a more reliable transistor device.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

Figure 1:
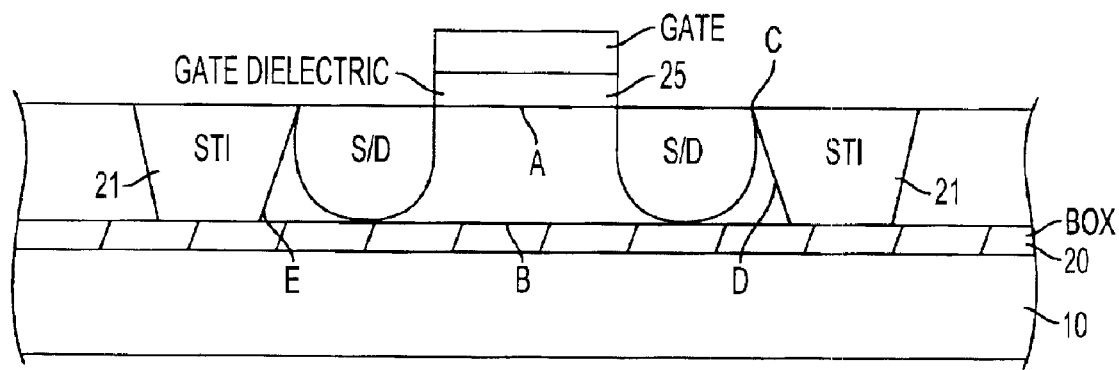
FIG. 1 is a cross-sectional view of a conventionally formed fully-depleted SOI structure with varying regions in which the present invention can be employed.

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation. In addition, the semiconductor need not be silicon-based, but could be based on silicon-germanium, silicon-on-insulator, silicon-on-saphire, germanium, or gallium arsenide, among others.

The term "SOI" used in the following description may include any supporting structure including, but not limited to, a fully-depleted SOI structure or a partially-depleted SOI structure. SOI structures can be formed utilizing any number of conventional methods or techniques well-known in the art, including, but not limited to, silicon-on-sapphire, separation by implanted oxygen (SIMOX), and wafer bonding.

The term "passivating species" used in the following description may include any supporting species,including, but not limited to, deuterium. The term "non-passivating species" used in the following description may include any supporting species including, but not limited to, hydrogen. A non-passivating species for purposes of this invention, includes any species, such as hydrogen atoms, that are undesirably occupying trap sites in a semiconductor device. A passivating species for purposes of this invention, includes any species, such as deuterium, that are desirably provided so that the passivating species can occupy the trap sites in a semiconductor device.

The present invention provides a structure produced by a novel annealing sequence which effectively passivates trap sites with deuterium. The processing sequence of the present invention occurs prior to the deuterium anneal or passivating alloy step in forming semiconductor integrated circuit devices. As such, the invention finds particular utility with MOS transistors such as CMOS structures, and more particularly with SOI structures, including SOI MOSFET transistors.

However, the present invention is not limited to specific device structures. Furthermore, the present invention is not intended to be directed or limited to a particular device formed on a semiconductor substrate. Rather, the present invention is directed to passivating any device possessing a dielectric film which includes trap sites and in which increased deuterium incorporation is desired. The deuterium passivation process of the present invention effectively increases the trap sites that are passivated by a deuterium anneal, making them more immune to hot carrier effects, and therefore finds a broad application within the semiconductor manufacturing industry.

Hot carrier effects are typically attributed to hydrogen desorption at an oxide interface. The present invention has particular application in processing SOI (silicon on insulator) devices due to the presence of two interfaces in the SOI structure. The first is the gate oxide/silicon interface (e.g., the gate oxide/gate electrode interface) and the second one is the silicon/buried oxide interface (i.e., BOX). As mentioned previously, the invention is equally applicable to CMOS devices. Compared to CMOS devices, SOIT devices possess more interface trap sites and thus, the methods of the present invention are particularly useful in SOI device fabrication.

Although the gate insulator material described herein is referred to as silicon dioxide, it is to be understood that the present invention also applies to gates that also contain nitrides, such as oxynitride gate dielectrics, or are solely comprised of nitrides, or that include other possible gate insulator materials, such as, tantalum pentoxide for example. The methods of the present invention are particularly useful when high-K (high dielectric constant) gate materials are used. These high-K dielectric materials utilize a minimally thin layer of silicon oxide as a buffer material close to the silicon interface. As a result, high-K dielectric devices generally have more trap sites than regular oxides.

Furthermore, deuterium can be incorporated into the fabricated semiconductor device by implantation, diffusion, or other techniques well-known in the art. Deuterium incorporation can also occur at many stages during semiconductor fabrication. For example, when the last metallization layer is completed: deuterium can be incorporated into the dielectric and then annealed in a conventional manner. Another example is implanting deuterium into the sidewall material. In another example, deuterium is incorporated into the silicon, below the gate oxide, in the region that comprises the channel of the transistor at any point in the fabrication process. In still yet another example, deuterium can be incorporated at any point during device fabrication into the polysilicon that comprises the transistor gate which is above the gate oxide. As a result, it is readily apparent that there are many other possibilities from which the present invention can be employed prior to deuterium incorporation.

The invention will now be explained with reference to FIGS. 1–5, which illustrate exemplary embodiments of a silicon-on-insulator device constructed in accordance with the invention.

There are at least five regions, particularly in SOI devices, that can significantly benefit from the deuterium passivation methods of the present invention (some of which were briefly described above). These five regions will now be explained with reference to FIG. 1, which illustrates the regions of a conventional fully-depleted silicon-on-insulator device. For purposes of a simplified description, structural details of the conventionally formed SOI transistor are omitted.

In FIG. 1, the SOI device contains five regions labeled A, B, C, D, E respectively, where trap sites can form. Region A illustrates the gate dielectric 25 and SOI film interface. In region A, many trap sites are generated under the gate and in the surrounding gate stack spacer regions (not illustrated). Region B illustrates the buried oxide area (BOX) 20 and SOI film interface. In region B, trap sites are generated due to the poor quality of the BOX 20 area, which is particularly prevalent in SIMOX wafers. Region C illustrates the top corner near the shallow trench isolation (STI) 21 and active area. In region C, trap sites are generated due to the heavy stress that this region undergoes. Region D illustrates the areas along the STI 21 sidewalls. In region D, traps sites are generated due to the STI's 21 different crystallographic orientation than (100) crystal orientations (e.g., silicon). Region E illustrates the bottom corner near the STI 21 and BOX 20 area. In region E, trap sites are generated due to the stress this region undergoes. Further, the STI 21 area comes into direct contact with the BOX 20 area, which is already of poor quality, generating even more trap sites.

Figure 2:
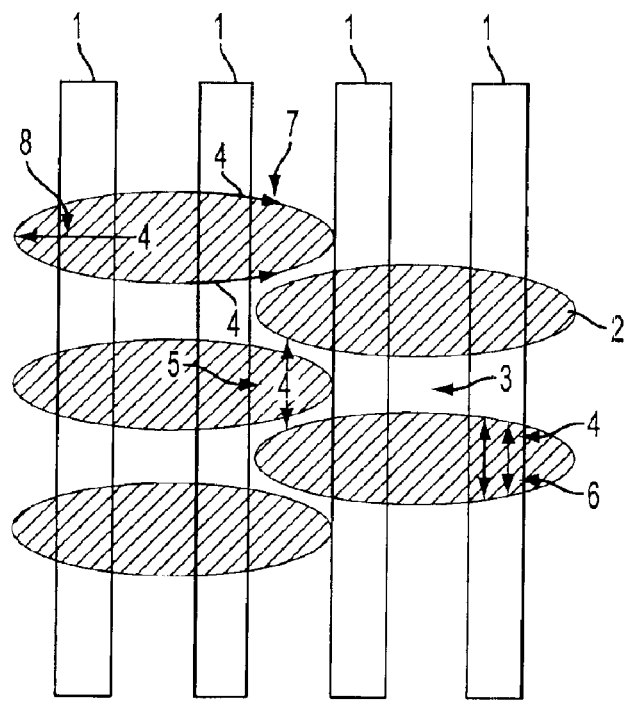
FIG. 2 is a cross-sectional top-down view of an illustrative typical DRAM cell layout, which may also employ the invention.

Significantly, trap sites near STI sidewalls D, illustrated in FIG. 1, can pose significant problems. This is a particular problem for narrow-width SOI structures. FIG. 2 is a cross-sectional top-down view of a typical DRAM cell layout. In FIG. 2, gates 1 (word lines) and active areas 2 (the elliptical circles) interact in multiple regions. Surrounding each of the gates 1 and active areas 2 are isolation (STI) regions 3. For instance, individual MOS devices can be isolated from each other by a shallow trench that is etched into the silicon layer (not illustrated). STI regions 3 are usually formed before fabricating well structures. One advantage of utilizing an STI isolation structure is that it provides a planar surface for further processing. The shallow trench then normally undergoes thermal oxidation and is subsequently filled with a deposited oxide to render the STI region non-conducting. The desired device 60 is then fabricated on the areas of silicon 10 defined by the STI trenches 3 as illustrated in FIG. 1.

In FIG. 2, dominant current leakage paths are illustrated as arrows 4. In an SOI DRAM for example, leakage along STI corners is critical. Adequate passivation of this interface is very important to avoid severe refresh problems and variable retention time fails in SOI DRAM structures. Thus, an SOI DRAM has narrow-width (or pass) transistors in the array. STI sidewalls possess different crystallographic planes than (100) crystal orientation (e.g., silicon) as mentioned previously. As a result, the silicon density is high and more trap sites are located along those planes. Cell-to-cell leakage 5 can also occur across the STI fields. Gate induced leakage 6 can also occur as FIG. 2 illustrates. Leakage can also occur along STI corners 7 or through sub-threshold leakage 8 across the transistor channel. The methods of the present invention can greatly reduce the number of trap sites at all of these locations. FIG. 2 illustrates only some possible current leakage paths that arise in a device as a result of the plurality of trap sites that are present.

Figure 3:
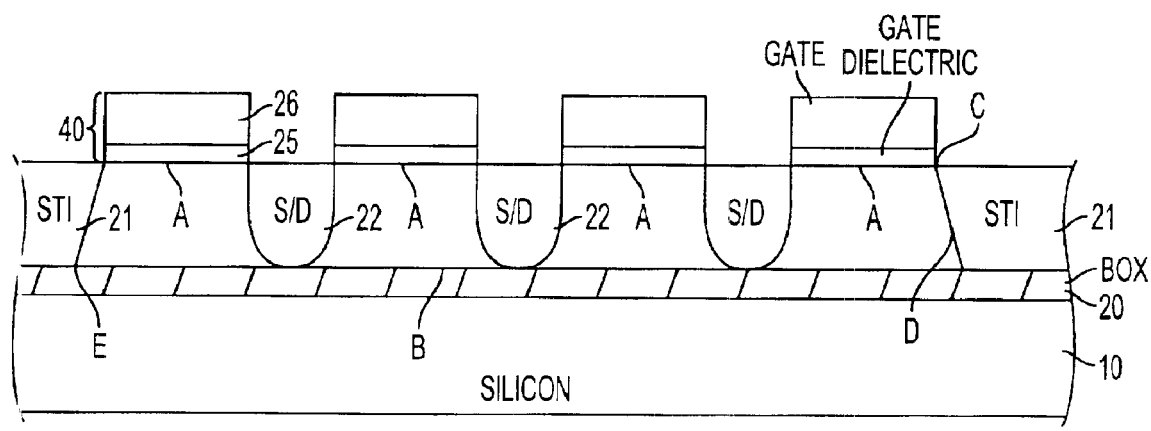
FIG. 3 is a cross-sectional close-up view of the active area of a MOSFET transistor.

FIG. 3 is an expanded cross-sectional view of a single active area 2 illustrated in FIG. 2. As FIG. 3 illustrates, there are a plurality of gate stack structures 40 comprising a gate dielectric 25 and a gate 26. There are a plurality of source/drain regions 22 that are in contact with the BOX region 20. Isolation areas 21 are shallow trench isolation regions as FIG. 3 illustrates. As FIG. 3 further illustrates, leakage can occur along STI corners C, D, and E, and through leakage of the gate A (as also illustrated in FIG. 1). The methods of the present invention greatly reduces the number of trap sites at these locations A, B, C, D, and E among other leakage sites which are not illustrated.

Figure 4:
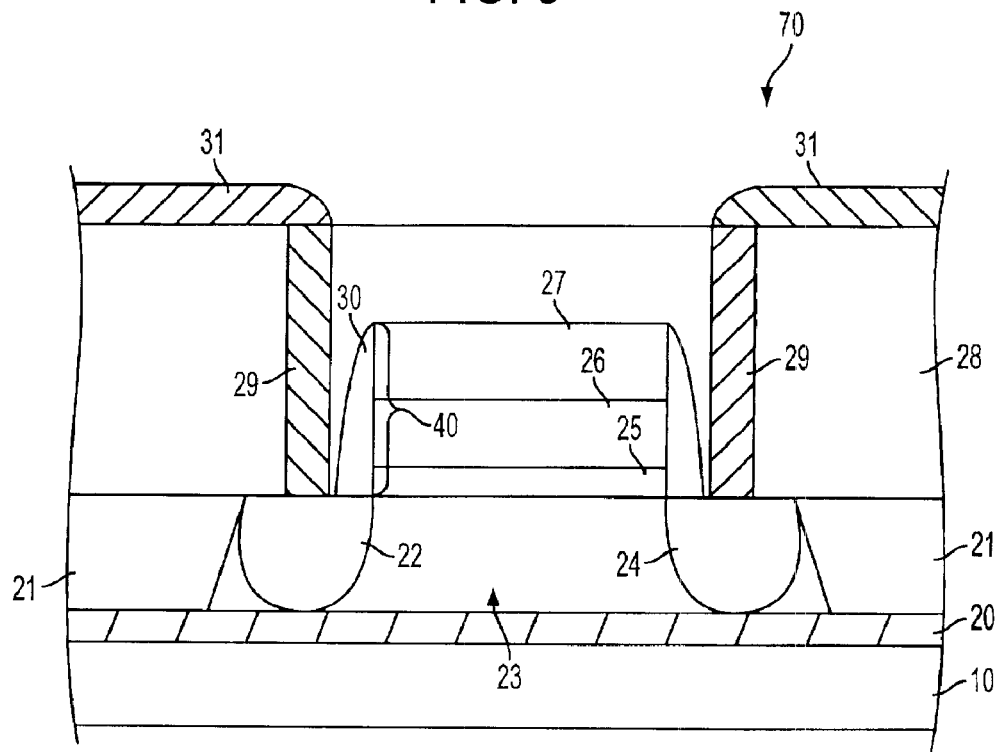
FIG. 4 is a cross-sectional view of an illustrative MOSFET transistor with respect to which a process according to the present invention will be described.

The methods of the present invention will now be discussed in greater detail in reference to FIGS. 4 and 5. FIG. 4 is a cross-sectional view of a conventionally formed single SOI MOSFET transistor. A single transistor 70 is shown in FIG. 4 to simplify the discussion and it should be understood that the methods of the present invention can be used with any SOI transistor fabricated, as well as with non-SOI transistors. The FIG. 4 MOSFET transistor 70 is formed over a semiconductor substrate 10 of a first conductivity type and an insulating layer 20, for example, BOX layer 20 provided on the semiconductor substrate 10, e.g., silicon layer. Oxide isolation regions 21, e.g., shallow trench isolation (STI) regions, are formed within a silicon layer 10 which is above insulating layer 20 and extends down to the insulating layer 20, e.g., an oxide insulating layer, to isolate the transistor from other structures, and extends below insulating layer 20. The source 22 and drain 24 are of the same conductivity, e.g., N-type conductivity, whereas the channel 23 has the conductivity of the silicon layer 10 in which the source/drain regions are respectively formed, e.g., P-type conductivity.

An active region (e.g., active area 2 illustrated in FIGS. 2 and 3) extending between adjacent oxide isolation regions 21 comprises source, channel, and drain regions 22, 23, and 24, respectively. A transistor gate 40 is provided over the channel region 23. The transistor gate comprises a gate dielectric layer 25 (typically silicon dioxide), a conducting layer 26, an insulating capping layer 27, and sidewall spacers 30. The gate dielectric 25 can comprise an oxide, nitride, high-K material, or other well-known materials used in the art. Similarly, the gate electrode 26 can be a polysilicon gate, a metal gate, or any other gate material that is well-known in the art. A passivation layer 28, such as BPSG, is provided over the illustrated SOI MOSFET transistor 70 and contact holes 29 are provided in the passivation layer 28 to source/drain regions 22, 24 which are filled with conductors 31.

As noted, FIG. 4 illustrates only one exemplary transistor structure which can benefit from the methods of the present invention. As is well-known in the art, there are a number of different structures (not illustrated) and modifications to FIG. 4, in which the methods of the present invention can be applied with equal effectiveness. For instance, silicon layer 10 can be of a p-type conductivity and drain regions 24 and source regions 22 are of n-type conductivity to produce an NMOS device. Alternatively, silicon layer 10 can be of n-type conductivity and drain regions 24 and source regions 22 are of p-type conductivity to produce a PMOS device. Further, the techniques for forming the SOI MOSFET transistor 70 illustrated in FIG. 4 are well-known in the art.

In essence, normal MOSFET device fabrication processes occur up to a point where a trap site deuterium passivation operation is desired for a fabricated structure. For example, with respect to the FIG. 4 structure, passivation operation may be employed after transistor formation and before or subsequent to contact 31 formation, or after formation of contact 31 and prior or subsequent to upper level metallization processes. Passivation may also occur at other steps in the fabrication process following transistor formation. Suffice it to say that a deuterium anneal can occur at any convenient point during device fabrication. Further, the step of electrically stressing the device can occur repeated times if desired, and at any convenient point during device fabrication as mentioned-above.

In accordance with the invention, prior to deuterium passivation, a fabricated semiconductor device, e.g., a transistor, is electrically stressed. Electrically stressing, also termed electrically pre-stressing, the device creates a large amount of hot electrons (e.g., hot carriers) that removes any existing hydrogen (e.g., non-passivating species) occupying various trap sites. However, hot carriers can also remove other non-passivating species as well besides hydrogen. Depending upon the device fabricated, traps sites can be located at a gate dielectric/SOI film interface (FIG. 1, A), a BOX/SOI film interface (FIG. 1, B), the top corner near STI and the active area stress region (FIG. 1, C), along the STI trench sidewalls (FIG. 1, D), or at the bottom corner near STI and BOX stress region (FIG. 1, E). FIGS. 1–3 discussed previously, illustrates at least some of the regions at which trap sites are present in an SOI MOSFET transistor device. However, the methods of the present invention are applicable to any device possessing trap sites.

Electrically stressing the semiconductor device creates more hot carriers that are colliding at the silicon/silicon dioxide interface and removing hydrogen from the dangling bonds at the interface. As a result of electrically stressing the device, a substantial amount of hydrogen is removed from the trap sites (as previously discussed and illustrated in FIGS. 1–3). Immediately after electrically stressing the semiconductor device, a deuterium passivation anneal is carried out. This is quickly done to ensure that hydrogen will not reoccupy the trap sites they were just removed from.

Figure 5:
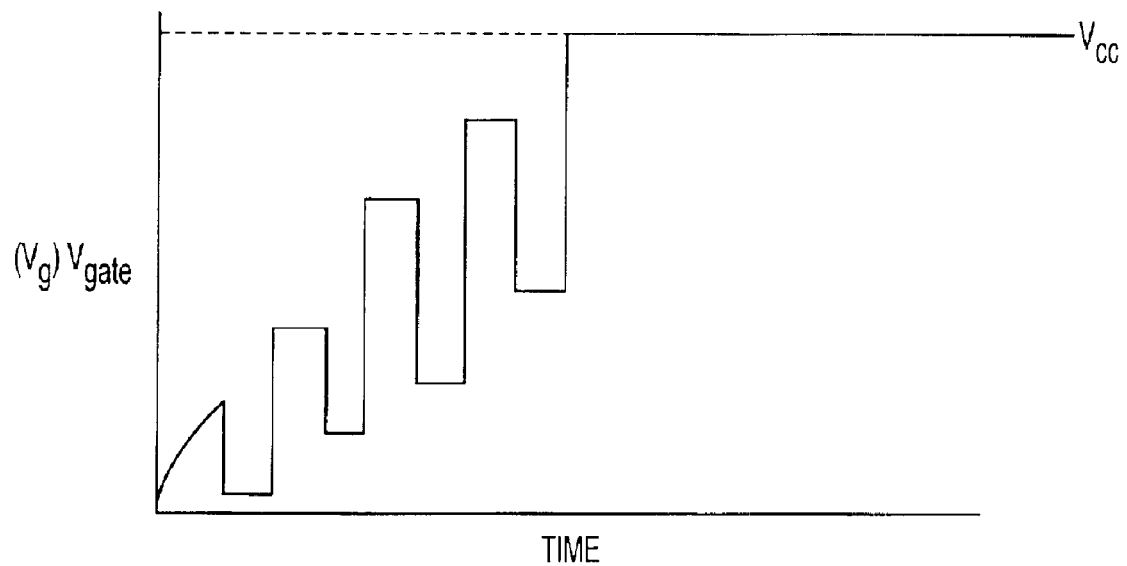
FIG. 5 is a graph illustrating different biasing conditions of a MOSFET transistor prior to a deuterium anneal process.

The device is electrically pre-stressed (e.g., electrically stressed) through a bias scheme illustrated in FIG. 5. The bias scheme applies a high potential to the drain, relative to the source, to electrically pre-stress the device creating hot electrons (e.g., hot carriers) near the source region which migrate toward the drain region. As the hot electrons, created near the source, move toward the drain region, the hot electrons gain energy. The migration of hot electrons potentially degrades the device due to charge-trapping near the drain region, the gate oxide, and/or near the spacers. As a result, if hot carriers (e.g., hot electrons) are created near the source-side of the device, device degradation can be minimized.

The bias scheme includes a medium to high potential which is still significantly less than the device breakdown potential which is applied to the drain (Vcc), while the gate is pulsed negatively (Vg). The applied voltage potential is at an operational supply voltage of the transistor. This creates hole/electron pairs (e.g., hot carriers) on the source side rather than the drain side due to the high electric field created in the source side of the device. The high energy electrons generated on the source side effectively remove the hydrogen, or any other non-passivating species from trap sites. This occurs on at least both interfaces $SiO_2$/silicon (gate dielectric and SOI film interface A illustrated in FIG. 1) and BOX/silicon B (illustrated in FIG. 1) for instance.

The device is electrically stressed under peal,-substrate current conditions. Peak-substrate current conditions typically occur where the gate voltage is approximately close to Vd/2, where Vd is the drain voltage. The applied voltage potential is at an operational supply voltage of the transistor. Utilizing these peak-substrate current conditions maximizes hot carriers near drain overlap regions (Vd=high, Vg=above threshold voltage, Vt=threshold voltage, typically about approximately Vd/3). This step removes hydrogen from at least the silicon/gate oxide interface (e.g., the gate dielectric and SOI film interface A illustrated in FIG. 1), and more importantly, from the silicon/buried oxide interface B, illustrated in FIG. 1, which is a poor quality oxide/silicon interface.

The device is also electrically stressed at conditions that maximizes hot carriers at the source overlap region (Vd=high, Vg=negative, with a negative drain pulse applied to the gate). A negative drain pulse is applied to the gate simply by generating negative pulses in the gate bias waveform as the drain voltage is applied. Electrically pre-stressing the device under these conditions creates a high electric field. As mentioned above, the peak-substrate current conditions typically occur when the gate voltage is approximately close to Vd/2. This step drives the device in bipolar mode and creates hot carriers in the region close to the source. The device is driven in bipolar mode by forward-biasing the source junction. This step removes hydrogen from both the silicon/gate oxide interface A (illustrated in FIG. 1) which is close to the source and also from the back interface, i.e., the silicon/buried-oxide interface B (illustrated in FIG. 1).

The bias conditions under which the device is electrically stressed are chosen so that the device is only moderately stressed. As a result, the device fully recovers its pre-stress characteristics after the alloy/passivation steps that follow. Bias conditions are optimized by examining an individual device in the bench (i.e., measuring I-V curves). The bias conditions examined are gate, drain, source, and substrate bias conditions. The device experiences full recovery of its pre-stress characteristics because the interface trap state density is similar to that which existed prior to electrically pre-stressing the device. Thus, the device fully recovers its pre-stress characteristics after the deuterium passivation step, or any other subsequent passivation annealing step.

The deuterium passivation step occurs immediately after electrically stressing the device. In the context of this invention, the term immediately means that a deuterium passivation anneal, or any other passivation annealing process, is carried out quickly enough so that hydrogen, or any other non-passivating species, does not reoccupy the trap sites.

As mentioned previously, incorporating deuterium into the fabricated transistor device can occur by implantation, diffusion, or other techniques well-known in the art. Furthermore, a deuterium anneal can occur at any point during device fabrication depending upon the device fabricated. As a result, the methods of the present invention can be utilized at any point after device fabrication, or integrated into the device fabrication processes, and prior to a deuterium anneal.

For instance, if the semiconductor device fabricated is a CMOS device, the device can be electrically pre-stressed as part of the final thermal processing step, for example, after the drain, source, and gate contacts and interconnect metallization have been completed. Electrically stressing the CMOS device at this point followed with a deuterium alloying passivation process, results in a higher concentration of deuterium in the gate insulator layer and particularly at the gate insulator/channel interface.

It is preferred that the methods of the present invention be carried out at temperatures below 650° C. Electrically pre-stressing the device at lower temperatures, such as below 650° C., increases hot carriers compared to ambient or hot temperatures, e.g., temperatures greater than 650° C. This enables a device to be fabricated for low-thermal budget processes. Normally, a deuterium passivation step is carried out as the very last stage in a process. If there is a need for more than one deuterium anneal, it is preferred that electrically stressing of the device occur subsequent to the first deuterium anneal and before any further subsequent deuterium anneals. Thus, the methods of the present invention can also be utilized multiple times, e.g., electrically pre-stressing the device prior to each deuterium anneal, if more than one deuterium anneal is carried out.

In one embodiment of the invention, electrically stressing the device can be incorporated as part of the wafer-reliability test during the normal process sequence. Incorporating the methods of the present invention during a wafer-reliability test simplifies the process at-d reduces costs. However, implementation of the processing sequences described above can be equally effective if integrated as a simple process change. For instance, the methods of the present invention can be implemented earlier if it is advantageous, such as after source and drain fabrication is completed. As a result, electrical pre-stressing of the device may occur at any point, including after device fabrication so long as a deuterium anneal has not been completed.

As a result of the methods described above, hot carriers are preferably created on the source side rather than the drain side, and the hot carriers created then migrate to the drain overlap region. These hot carriers lose energy as they travel from the source region to the drain region. As a result, hot carriers have less probability of impact ionization in the drain region.

It should also be appreciated that although the methods of the present invention are directed toward utilizing a deuterium passivation process. The methods of the present invention find broader application within the semiconductor industry. For example, the trap sites discussed previously can be passivated with different passivating species other than deuterium. Thus, the present invention is applicable in any circumstance where, prior to a passivation process or step, it is desired to remove, including but not limited to hydrogen from trap sites (e.g., any non-passivating species). Still further, the methods of the present invention can be used to remove any species, even subsequent passivating species that occupy trap sites.

The above description and drawings are only to be considered illustrative of exemplary embodiments which achieve the features and advantages of the invention. Although exemplary embodiments of the present invention have been described and illustrated herein, many modifications, even substitutions of materials, can be made without departing from the spirit or scope of the invention. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the appended claims.

What is claimed as new and desired to be protected by Letters Patent of the United States is:

1. A method of passivating trap sites in a semiconductor device, said method comprising:
   fabricating a semiconductor device on a semiconductor substrate;
   electrically stressing the semiconductor device to create hot carriers that remove non-passivating species from trap sites; and
   subsequently annealing said electrically stressed semiconductor device with a passivation process to passivate said trap sites.

2. The method as in claim 1, wherein said semiconductor device is a transistor comprising a source, a gate and a drain, and wherein said step of electrically stressing comprises applying a voltage potential to said drain while the gate is negatively pulsed, said voltage potential being less than the semiconductor device's breakdown potential.

3. The method as in claim 2, wherein said applied voltage potential is at an operational supply voltage of the semiconductor device.

4. The method as in claim 1, wherein said semiconductor device is a transistor comprising a source, a gate, and a drain, and wherein said step of electrically stressing creates a high electric field at said source.

5. The method as in claim 4, wherein said step of electrically stressing comprises applying peak-substrate current conditions.

6. The method as in claim 5, further comprising driving said transistor in a bipolar mode when the applied gate voltage is approximately Vd/2, where Vd is the drain voltage.

7. The method as in claim 1, wherein said semiconductor device is a transistor further comprising a source, a gate, and a drain, and wherein said step of electrically stressing produces hot carriers near a drain overlap region.

8. The method as in claim 7, wherein said step of electrically stressing comprises applying peak-substrate current conditions where Vg is approximately Vd/2, and Vg is the gate voltage and Vd is the drain voltage.

9. The method as in claim 7, wherein said transistor has trap sites, and wherein said hot carriers remove hydrogen from the trap sites.

10. The method as in claim 1, wherein said semiconductor device is a transistor comprising a source, a gate, and a drain, and wherein said step of electrically stressing produce hot carriers.

11. The method as in claim 10, wherein said transistor has trap sites, and wherein said hot carriers remove hydrogen from the trap sites.

12. The method as in claim 1, wherein said semiconductor device is a transistor comprising a source, a gate, and a drain, and wherein said step of electrically stressing produce hot carriers near a source overlap region.

13. The method as in claim 12, wherein said step of electrically stressing comprises applying peak-substrate current conditions.

14. The method as in claim 13, wherein said peak-substrate current conditions occur where Vg is approximately Vd/2, and Vd is a negative drain voltage and Vg is the gate voltage.

15. The method as in claim 12, wherein said transistor has trap sites, and wherein said hot carriers remove hydrogen from the trap sites.

16. The method as in claim 1, wherein said step of electrically stressing is effected at a temperature less than approximately 650° C.

17. The method as in claim 1, wherein said semiconductor substrate is a silicon-on-insulator substrate.

18. The method as in claim 1, wherein said passivation process is a deuterium passivation process.

19. The method as in claim 1, wherein said semiconductor device further comprises a gate dielectric layer formed over said substrate, said gate dielectric forming an interface with said substrate, and said step of electrically stressing further comprises electrically stressing the interface prior to said step of annealing.

20. The method as in claim 19, wherein said interface has trap sites, and wherein said step of electrically stressing produces hot carriers.

21. The method as in claim 20, further comprising removing hydrogen from said trap sites with the hot carriers.

22. The method as in claim 1, wherein said semiconductor device further comprises a buried oxide layer formed in said substrate, said buried oxide layer forming an interface with said substrate, and said step of electrically stressing further comprises electrically stressing the interface prior to said step of annealing.

23. The method as in claim 22, wherein said interface has trap sites, and wherein said step of electrically stressing produces hot carriers.

24. The method as in claim 23, further comprising removing hydrogen from said trap sites with the hot carriers.

25. The method as in claim 1, wherein said semiconductor device further comprises oxide isolation regions in said substrate, said oxide isolation regions and said substrate forming an interface, and said step of electrically stressing further comprises electrically stressing the interface prior to said step of annealing.

26. The method as in claim 25, wherein said oxide isolation regions are shallow trench isolation regions, and wherein said shallow trench isolation regions have trap sites.

27. The method as in claim 26, wherein said trap sites are located along the oxide isolation region sidewalls.

28. The method as in claim 25, wherein said interface has trap sites, and wherein said step of electrically stressing produces hot carriers.

29. The method as in claim 28, further comprising removing hydrogen from said trap sites with the hot carriers.

30. The method as in claim 1, wherein said semiconductor device further comprises shallow trench isolation regions and a buried oxide layer in said substrate, said shallow trench isolation regions forming interfaces with said buried oxide layer and said substrate, and said step of electrically stressing further comprises electrically stressing said interfaces prior to said step of annealing.

31. The method as in claim 30, wherein said interfaces have trap sites, and wherein said step of electrically stressing produces hot carriers.

32. The method as in claim 31, further comprising removing hydrogen from said trap sites with the hot carriers.

33. A method of fabricating an integrated circuit, said method comprising the steps of:
  fabricating a transistor device on a silicon-on-insulator substrate, said transistor comprising a source, a gate, and a drain;
  electrically stressing said transistor to generate hot carriers which remove hydrogen occupying trap sites in the transistor; and
  subsequently annealing said electrically stressed transistor with a passivation process to passivate said trap sites.

34. The method as in claim 33, wherein said step of electrically stressing comprises applying a voltage potential to said drain while the gate is negatively pulsed, wherein said voltage potential is less than the transistor's breakdown potential.

35. The method as in claim 34, wherein said applied voltage potential is at an operational supply voltage of the transistor.

36. The method as in claim 33, wherein said step of electrically stressing creates a high electric field at said source.

37. The method as in claim 36, wherein said step of electrically stressing further comprises applying peak-substrate current conditions where the gate voltage is approximately Vd/2, and Vd is the drain voltage.

38. The method as in claim 33, wherein said step of electrically stressing produces hot carriers near a drain overlap region in said transistor.

39. The method as in claim 38, wherein said step of electrically stressing further comprises applying peak-substrate current conditions where Vg is approximately Vd/2, and Vg is the gate voltage and Vd is the drain voltage.

40. The method as in claim 38, further comprising removing hydrogen from said trap sites with the hot carriers.

41. The method as in claim 33, further comprising removing hydrogen from said trap sites with the hot carriers.

42. The method as in claim 33, wherein said step of electrically stressing produces hot carriers near a source overlap region in said transistor.

43. The method as in claim 42, wherein said step of electrically stressing further comprises applying peak-substrate current conditions.

44. The method as in claim 43, wherein said peak-substrate current conditions occur where Vg is approximately Vd/2, and Vd is a negative drain voltage and Vg is the gate voltage.

45. The method as in claim 42, further comprising removing hydrogen from said trap sites with the hot carriers.

46. The method as in claim 33, wherein said step of electrically stressing is effected at a temperature of less than approximately 650° C.

47. The method as in claim 33, wherein said passivation process is a deuterium passivation process.

48. A method of fabricating a semiconductor device, said method comprising:
 forming a transistor on a semiconductor substrate, said transistor having a source, a gate, a drain, and a plurality of trap sites, with at least one hydrogen atom occupying at least one of said trap sites;
 removing at least one hydrogen atom from at least one trap site by electrically stressing said transistor by generating hot carriers; and
 providing deuterium atoms which bond to said trap site after said at least one hydrogen atom is removed.

49. The method as in claim 48, wherein said step of electrically stressing comprises applying a voltage potential to said drain while the gate is negatively pulsed, wherein said voltage potential is less than the transistor's breakdown potential.

50. The method as in claim 49, wherein said applied voltage potential is at an operational supply voltage of the transistor.

51. The method as in claim 48, wherein said step of electrically stressing further comprises creating a high electric field at said source.

52. The method as in claim 48, wherein said step of electrically stressing produces hot carriers near a drain overlap region in said transistor.

53. The method as in claim 52, wherein said step of electrically stressing further comprises applying peak-substrate current conditions.

54. The method as in claim 53, wherein said peak-substrate current conditions occur where Vg is approximately Vd/2, and Vd is the drain voltage and Vg is the gate voltage.

55. The method as in claim 48, further comprising removing at least one hydrogen atom from said trap sites with the hot carriers.

56. The method as in claim 48, wherein said step of electrically stressing produces hot carriers near a source overlap region in said transistor.

57. The method as in claim 56, wherein said step of electrically stressing further comprises applying peak-substrate current conditions.

58. The method as in claim 57, wherein said peak-substrate current conditions occur where Vg is approximately Vd/2, and Vd is a negative drain voltage and Vg is the gate voltage.

59. The method as in claim 56, further comprising removing at least one hydrogen atom from said trap sites with the hot carriers.

60. The method as in claim 48, wherein said step of electrically stressing is effected at a temperature of less than approximately 650° C.

61. The method as in claim 48, wherein said deuterium atoms are provided in a deuterium passivation process.

62. A method of reducing the number of trap sites in a semiconductor device, said method comprising:
 forming a transistor on a semiconductor substrate, said transistor having a source, a gate, a drain, and a plurality of trap sites with at least one non-passivating species occupying at least one of said trap sites;
 removing at least one non-passivating species from at least one trap site by electrically stressing said transistor; and
 subsequently providing at least one passivating species to replace said removed non-passivating species from said at least one trap site.

63. The method as in claim 62, wherein said step of electrically stressing comprises applying a voltage potential to said drain while the gate is negatively pulsed, wherein said voltage potential is less than the transistor's breakdown potential.

64. The method as in claim 63, wherein said applied voltage potential is at an operational supply voltage of the transistor.

65. The method as in claim 62, wherein said step of electrically stressing further comprises creating a high electric field at said source.

66. The method as in claim 62, wherein said step of electrically stressing produces hot carriers near a drain overlap region in said transistor.

67. The method as in claim 66, wherein said step of electrically stressing further comprises applying peak-substrate current conditions.

68. The method as in claim 67, wherein said peak-substrate current conditions occur where Vg is approximately Vd/2, and Vd is the drain voltage and Vg is the gate voltage.

69. The method as in claim 66, further comprising removing at least one non-passivating species from said trap sites with the hot carriers.

70. The method as in claim 62, wherein said step of electrically stressing produces hot carriers.

71. The method as in claim 70, further comprising removing at least one non-passivating species from said trap sites with the hot carriers.

72. The method as in claim 62, wherein said step of electrically stressing produces hot carriers near a source overlap region in said transistor.

73. The method as in claim 72, wherein said step of electrically stressing further comprises applying peak-substrate current conditions.

74. The method as in claim 73, wherein said peak-substrate current conditions occur where Vg is approximately Vd/2, and Vd is a negative drain voltage and Vg is the gate voltage.

75. The method as in claim 72, further comprising removing at least one non-passivating species from said trap sites with the hot carriers.

76. The method as in claim 62, wherein said step of electrically stressing is effected at a temperature of less than approximately 650° C.

77. The method as in claim 62, wherein said at least one passivating species is deuterium.

78. The method as in claim 77, wherein said deuterium is provided by a deuterium passivation process.

79. A method of passivating trap sites in a semiconductor device, said method comprising:
 forming a transistor having a plurality of trap sites, with non-passivating species occupying at least one of said trap sites;
 removing at least one non-passivating species from the trap sites by electrically stressing the transistor, wherein said step of electrically stressing comprises applying a voltage potential to said drain and applying a negative pulse to said gate; and
 subsequently providing at least one passivating species which bonds to said trap sites after said at least one non-passivating species is removed.

80. The method as in claim 79, wherein said applied voltage potential is less than the transistor's breakdown potential.

81. The method as in claim 79, wherein said applied voltage potential is at an operational supply voltage of the transistor.

82. The method as in claim 79, wherein said step of electrically stressing further comprises creating a high electric field at said source.

83. The method as in claim 82, wherein said step of electrically stressing further comprises applying peak-substrate current conditions.

84. The method as in claim 83, further comprising driving said transistor in a bipolar mode when the gate voltage is approximately Vd/2, and Vd is the drain voltage.

85. The method as in claim 79, wherein said step of electrically stressing produces hot carriers near a drain overlap region in said transistor.

86. The method as in claim 85, wherein said step of electrically stressing further comprises applying peak-substrate current conditions where Vg is approximately Vd/2, Vg is the gate voltage and Vd is the drain voltage.

87. The method as in claim 85, further comprising removing at least one non-passivating species from said trap sites with the hot carriers.

88. The method as in claim 79, wherein said step of electrically stressing produces hot carriers.

89. The method as in claim 88, further comprising removing at least one non-passivating species from said trap sites with the hot carriers.

90. The method as in claim 79, wherein said step of electrically stressing produces hot carriers near a source overlap region in said transistor.

91. The method as in claim 90, wherein said step of electrically stressing further comprises applying peak-substrate current conditions.

92. The method as in claim 91, wherein said peak-substrate current conditions occur where Vg is approximately Vd/2, and Vd is a negative drain voltage and Vg is the gate voltage.

93. The method as in claim 90, further comprising removing at least one non-passivating species from said trap sites with the hot carriers.

94. The method as in claim 79, wherein said step of electrically stressing is effected at a temperature of less than approximately 650° C.

95. The method as in claim 79, wherein said at least one passivating species is deuterium.

96. The method as in claim 95, wherein said deuterium is provided by a deuterium passivation process.

* * * * *

UNITED STATES PATENT AND TRADEMARK OFFICE
CERTIFICATE OF CORRECTION

PATENT NO.        : 6,969,618 B2                                          Page 1 of 1
APPLICATION NO. : 10/226283
DATED             : November 29, 2005
INVENTOR(S)       : Chandra Mouli It is certified that error appears in the above-identified patent and that said Letters Patent is hereby corrected as shown below:

Column 1, line 54, "frilly-depleted" should read --fully-depleted--;

Column 3, line 17, "(Si$^{31}$ +" should read --(Si +--;

Column 4, line 20, "silicon-on-saphire" should read --silicon-on-sapphire--;

Column 4, line 30, "species,including," should read --species including,--;

Column 5, line 4, "SOIT" should read --SOI--;

Column 7, line 56, "traps" should read --trap--;

Column 8, line 36, "peal,-substrate" should read --peak-substrate--;

Column 9, line 45-46, "that electrically" should read --that the electrically--; and Column 9, line 57, "at-d" should read --and--.

Claim 10, column 11, line 12, "produce" should read --produces--; and

Claim 12, column 11, line 18, "produce" should read --produces--.

Signed and Sealed this

Twenty-ninth Day of August, 2006

JON W. DUDAS
*Director of the United States Patent and Trademark Office*